United States Patent
Pellizzer et al.

(10) Patent No.: US 10,153,040 B2
(45) Date of Patent: *Dec. 11, 2018

(54) APPARATUSES AND METHODS FOR CURRENT LIMITATION IN THRESHOLD SWITCHING MEMORIES

(71) Applicant: MICRON TECHNOLOGY, INC., Boise, ID (US)

(72) Inventors: Fabio Pellizzer, Boise, ID (US); Hari Giduturi, Folsom, CA (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,402

(22) Filed: Nov. 30, 2017

(65) Prior Publication Data

US 2018/0090204 A1    Mar. 29, 2018

Related U.S. Application Data

(63) Continuation of application No. 15/470,492, filed on Mar. 27, 2017, now Pat. No. 9,870,820, which is a
(Continued)

(51) Int. Cl.
*G11C 11/00* (2006.01)
*G11C 13/00* (2006.01)
*G11C 29/50* (2006.01)

(52) U.S. Cl.
CPC ........ *G11C 13/0033* (2013.01); *G11C 13/004* (2013.01); *G11C 13/0004* (2013.01);
(Continued)

(58) Field of Classification Search
CPC ............ G11C 13/0033; G11C 13/0023; G11C 13/004; G11C 13/0069; G11C 29/50004; G11C 2029/5004
See application file for complete search history.

(56) References Cited

U.S. PATENT DOCUMENTS 5,815,458 A   9/1998  Chevallier et al.
6,141,250 A * 10/2000  Kashimura ........ G11C 16/0433
                                        365/185.11
(Continued)

OTHER PUBLICATIONS

Choi, Youngdon et al., "A 20nm 1.8V 8Gb PRAM with 40MB/s Program", ISSCC2012 / Session 2 / High Bandwidth DRAM & PRAM / 2.5, 2002, pp. all.

*Primary Examiner* — Pho M Luu
(74) *Attorney, Agent, or Firm* — Dorsey & Whitney LLP (57) ABSTRACT

Apparatuses and methods for limiting current in threshold switching memories are disclosed. An example apparatus may include a plurality of first decoder circuits, a plurality of second decoder circuits, an array of memory cells, and a control circuit. Each memory cell of the array of memory cells may be cells coupled to a pair of first decoder circuits of the plurality of first decoder circuits, and further coupled to a pair of second decoder circuits of the plurality of second decoder circuits. The control circuit may be coupled to the plurality of first decoder circuits and the plurality of second decoder circuits, and the control circuit may be configured to activate a first one of the pair of first decoder circuits coupled to a memory cell of the array of memory cells before a second one of the pair of first decoder circuits, and further configured to activate a first one of the pair of second decoder circuits coupled to the memory cell of the array of memory cells before a second one of the pair of second decoder circuits to access the a memory cell.

20 Claims, 7 Drawing Sheets

Related U.S. Application Data continuation of application No. 14/950,413, filed on Nov. 24, 2015, now Pat. No. 9,627,052.

(52) U.S. Cl.
CPC ...... *G11C 13/0007* (2013.01); *G11C 13/0023* (2013.01); *G11C 13/0026* (2013.01); *G11C 13/0028* (2013.01); *G11C 13/0061* (2013.01); *G11C 13/0069* (2013.01); *G11C 29/50004* (2013.01); *G11C 2013/009* (2013.01); *G11C 2029/5004* (2013.01); *G11C 2213/72* (2013.01); *G11C 2213/76* (2013.01)

(56) References Cited

U.S. PATENT DOCUMENTS

| | | |
|---|---|---|
| 6,233,173 B1 | 5/2001 | Chevallier et al. |
| 6,256,262 B1 * | 7/2001 | Chen .................. G11C 5/025 365/189.05 |
| 6,373,749 B1 * | 4/2002 | Atsumi ................ G11C 16/16 365/185.23 |
| 7,215,587 B2 | 5/2007 | Lee et al. |
| 7,940,554 B2 | 5/2011 | Scheuerlein et al. |
| 8,411,488 B2 | 4/2013 | Kawabata et al. |
| 8,593,855 B2 | 11/2013 | Onishi et al. |
| 8,817,525 B2 | 8/2014 | Ishihara et al. |
| 9,305,644 B2 | 4/2016 | Kellam et al. |
| 9,627,052 B1 * | 4/2017 | Pellizzer ............ G11C 13/0023 |
| 9,870,820 B2 * | 1/2018 | Pellizzer ............ G11C 13/0033 |
| 2017/0200497 A1 | 7/2017 | Pellizzer et al. |

* cited by examiner

APPARATUSES AND METHODS FOR CURRENT LIMITATION IN THRESHOLD SWITCHING MEMORIES

CROSS REFERENCE TO RELATED APPLICATION(S)

This application is a continuation of U.S. patent application Ser. No. 15/470,492 filed Mar. 27, 2017 and issued as U.S. Pat. No. 9,870,820 on Jan. 16, 2018, which is a continuation of U.S. patent application Ser. No. 14/950,413, filed Nov. 24, 2015 and issued as U.S. Pat. No. 9,627,052 on Apr. 18, 2017. The aforementioned applications and issued patents are incorporated herein by reference, in their entirety, for any purpose.

BACKGROUND

Conventional memories include memory cells that are accessed by turning on a transistor that couples the memory cell, e.g., a capacitor, with a bitline or a wordline. In contrast, threshold-type memories include memory cells that are accessed by providing a voltage across a memory cell, and the data value stored is based on a threshold voltage of the memory cell. For example, the data value may be based on whether the threshold voltage of the memory cell is exceeded and the memory cell conducts current, in response to the voltage provided across the memory cell. The data value stored may be changed, for example, by applying a voltage sufficient to change the threshold voltage of the memory cell. One example of a threshold-type memory cell may be a cross-point memory cell.

With threshold-type memories, a memory cell that "thresholds" in response to a voltage provided across it may be susceptible to changes or damages when the memory cells thresholds and begins to conduct current. The current conducted by a memory cell may spike at the time the memory cell thresholds, and the resulting spike in current may subject the cell to undesirable conditions that may damage the cell, or otherwise negatively impact the memory cell (e.g., degrade the data value stored by the memory cell, change the data value stored by the memory cell, etc.).

DETAILED DESCRIPTION OF PREFERRED EMBODIMENTS

Apparatuses and methods for limiting current spikes in threshold switching memories are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Memories conventionally include an array of memory cells with each memory cell coupled to at least two access lines. For example, a memory cell may be coupled to a bitline and a wordline. As such, each access line may be coupled to a large number of memory cells. To select a memory cell, a decoder circuit associated with a first access line coupled to the cell and a decoder circuit associated with a second access line coupled to the cell may both provide a voltage and/or a current to their respective access lines. By applying voltages and/or currents to the respective access lines, the memory cells may be accessed, for example, to write data on the memory cell or read data from the memory cell.

Because each access line may be coupled to a large number of memory cells, each memory cell may be a different physical distance from respective decoder circuits. Further, because the physical distance between each cell and their respective decoder circuits is different, a parasitic load associated with each memory cell may be different. The parasitic load may include a resistance of the metal traces used to form the access lines, and parasitic capacitances associated with both the metal traces and the associated decoder circuits. As such, each memory cell may have a different associated parasitic load due to their respective relative physical distances from the respective decoder circuits. Additionally, the parasitic loads associated with each memory cell may affect the voltages and/or currents the memory cell receives when the respective decoder circuits provide the voltages to the access lines associated with the memory cell. That is, while the voltage provided to the access line by the decoder circuit may be the same for every memory cell along the access line, the voltage and timing of the voltage which a particular memory cell receives may be different from other memory cells along the same access line due to its specific location along the access line with respect to the providing decoder circuit.

In some embodiments of the disclosure, decoder circuits may be placed on each end of the access lines so that a pair of decoder circuits is associated with each access line. The decoder circuits may be less resistive than the associated access lines, and, as a result, an RC characteristic of the access lines coupled to a memory cell may be more affected by the access lines than the decoder circuits. In such a configuration, decoder circuits at each of end of a respective access line may be activated when selecting a memory cell.

Accordingly, the voltage, for example, on the associated access line may be large enough to ensure the memory cell thresholds, e.g., is turned on or accessed, as desired due to the level of voltage on both access lines. In some embodiments, the decoder circuits of the pairs of decoder circuits that are farther away from a target memory cell may be used, at least, initially to select the target cell. The parasitic load associated with the memory cell and the respective decoder circuits that are farther away may be larger than the parasitic load associated with the memory cell and the respective decoder circuits that are closer. By initially selecting the memory cell using the decoder circuits that are farther away, the larger parasitic RC load may smooth the current spike, which may reduce the chance of disturbing the stored state or setting the memory cell too hard. The parasitic RC load may behave as a filter, which may limit the magnitude of the current spike. In some embodiments, a memory address for the target memory cell may determine which decoder circuit of the pairs of decoder circuits to activate first so to reduce the current spike. That is, the memory address may be used to determine which decoder circuit of the pairs of decoder circuit is physically farther from the memory cell, or which the memory cell is farther from, and conversely, which of the decoder circuits of the pairs of decoder circuits is closer to the target memory cell. The relative distance of the target memory cell from the respective pairs of decoder circuits may determine an order the decoder circuits are activated. In some embodiments, only the decoder circuits that are farther from the target memory cell may be activated to threshold, e.g., select, a target memory cell. In some embodiments, the decoder circuits that are closer to the target memory cell may be activated after the decoder circuits that are farther from the target memory cell have been activated. For example, a wordline decoder circuit farther from a target memory cell may be activated, then the wordline decoder circuit closer to the target memory cell may be subsequently activated. Bitline decoder circuits may be similarly activated.

In some embodiments in which the resistance of a decoder circuit is greater than the resistance of the associated access lines, the decoder circuits closer to a targeted memory cell may be selected first in order to increase the RC characteristics around the target cell. As such, by increasing the RC characteristic around a target cell, the chance of disturbing the target cell may be reduced. In the following disclosure, the example of low resistive decoder circuits is used for illustrative purposes, but is non-limiting. For example, the decoder selection sequence discussed with respect to FIGS. 1 through 6 may be reversed for embodiments in which the decoder circuit has a larger resistance than the associated access lines.

Figure 1:
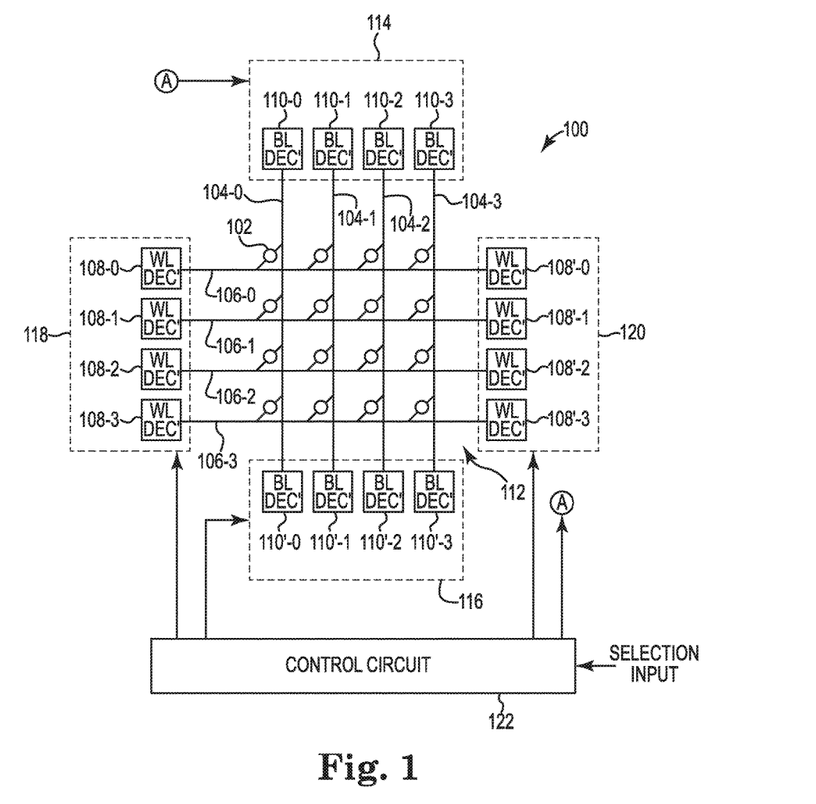
FIG. 1 is a simplified block diagram of a portion a memory according to an embodiment of the present disclosure.

FIG. 1 is a simplified block diagram of a portion of a memory 100 according to an embodiment of the present disclosure. The memory 100 may be, for example, non-volatile memory, such as a cross-point memory, or a volatile memory. The memory 100 may include an array 112 containing a plurality of memory cells 102, a plurality of bitlines 104 (104-0, 104-1, 104-2, and 104-3), a plurality of wordlines 106 (106-0, 106-1, 106-2, and 106-3), a plurality of bitline decoder circuits, a plurality of wordline decoder circuits, and a control circuit 122. In some embodiments, the memory cells 102 each include a selector and a storage element. When the selector of a cell thresholds, the storage element may be accessed to read or write a data value to the storage element. In other embodiments, a memory cell 102 may not include a separate selector and storage element, but have a configuration so that the memory cell nonetheless acts as having a selector and storage element. For ease of discussion. FIG. 1 may be discussed in terms of bitlines, wordlines, bitline decoder circuits, and wordline decoder circuits, but these designations are non-limiting. The scope of the present disclosure should be understood to cover memory cells that are coupled to multiple access lines and accessed through respective decoder circuits, where an access line may be used to store data into a memory cell and read data from the memory cell. To reduce or eliminate the occurrence of a current spike when a target memory cell thresholds, the wordline decoder circuit of the pair of wordline decoder circuits that is farther away from the target memory cell may be activated before the wordline decoder circuit that is closer to the target memory cell is activated. The wordline decoder circuit that is closer to the target memory cell may be subsequently activated. Likewise, the bitline decoder circuit of the pair of bitline decoder circuits that is farther away from the target memory cell may be activated before the bitline decoder circuit that is closer to the target memory cell is activated. The bitline decoder circuit that is closer to the target memory cell may be subsequently activated.

The plurality of bitline decoder circuits may include a first group of bitline decoder circuits 114 and a second group of bitline decoder circuits 116. The first group of bitline decoder circuits 114 may include a first plurality of bitline decoder circuits 110, and the second group of bitline decoder circuits 116 may include a second plurality of bitline decoder circuits 110'. Each of the plurality of bitlines 104 may have an associated pair of bitline decoder circuits that include one bitline decoder circuit from the first group of bitline decoder circuits 114, and one bitline decoder circuit from the second group of bitline decoder circuits 116. Accordingly, each of the first plurality of bitline decoder circuits 110 may be coupled to a corresponding one of the second plurality of bitline decoder circuits 110'. For example, the bitline 104-2 may be associated with the bitline decoder circuit 110-2 and the bitline decoder circuit 110'-2.

The plurality of wordline decoder circuits may include a first group of wordline decoder circuits 118 and a second group of wordline decoder circuits 120. The first group of wordline decoder circuits 118 may include a first plurality of wordline decoder circuits 108, and the second group of wordline decoder circuits 120 may include a second plurality of wordline decoder circuits 108', which may also be arranged into corresponding pairs of wordline decoder circuits 108, 108'.

The first and second groups of bitline decoder circuits 114, 116 and the first and second groups of wordline decoder circuits 118, 120 may be arranged around a perimeter of the array 112. The arrangement of the bitline and wordline decoder circuits may include the first plurality of bitline decoder circuits 110 arranged on an opposite side of the array 112 as the second plurality of bitline decoder circuits 110, and likewise for the pluralities of wordline decoder circuits 108, 108.

The plurality of bitlines 104 may be metal traces in the array 102, and formed from metal, such as copper, aluminum, silver, tungsten, or combinations thereof. The plurality of wordlines 106 may also be metal traces and formed from similar materials. The plurality of bitlines 104 and the plurality of wordlines 106 may have a uniform width and thickness along their respective lengths of the array 112. Accordingly, the plurality of bitlines 104 and the plurality of wordlines 106 may have a uniform resistance per length and a uniform parasitic capacitance per length so the resulting parasitic load may uniformly increase per length. As such, a parasitic load associated with a memory cell 102 may be different with respect to each bitline decoder circuit of the pair of bitline decoder circuits 110, 110' due to the difference in physical distance between the memory cell and each of the associated bitline decoder circuits. Likewise for the pair of wordline decoder circuits 108, 108'. Hence, for a given memory cell 102, a parasitic load may be less for the closer bitline and wordline decoder circuits than for the farther bitline and wordline decoder circuits. This difference in parasitic load may be used to reduce current spikes that occur when a target memory cell thresholds, e.g., is turned on, which may result in a negative voltage differential across the selected memory cell. By activating the farther of the two decoder circuits, at least, first, the current spike that results from the negative voltage differential may be reduced and/or eliminated. Reducing the current spike may limit any undesirable effects to the memory cell.

The plurality of bitlines 104 and the plurality of wordlines 106 may be arranged orthogonal to each other, and one memory cell of the plurality of memory cells 102 may be formed at, e.g., associated with, each intersection of a bitline 104 and a wordline 106. Each of the plurality of bitlines 104 and wordlines 106 may run through and extend outside of the array of 112. As such, each of the plurality of bitlines 104 may be coupled to respective ones of the plurality of bitline decoder circuits 110, 110' on opposite ends of the bitlines. For example, a bitline 104-1 may be coupled to the bitline decoder circuit 110-1 at one end and further coupled to the corresponding bitline decoder circuit 110'-1 at the other end. As such, for each bitline 104 of the plurality of bitlines 104 there may be an associated pair of bitline decoder circuits 110, 110'. The plurality of wordlines 106 may likewise be coupled to respective ones of the plurality of wordline decoder circuits 108, 108' on opposite ends of the wordlines such that each of the plurality of wordlines 106 there may be a pair of wordline decoders 108, 108'.

The plurality of bitline decoder circuits 110, 110' may be arranged on different sides of the array 112 than the plurality of wordline decoder circuits 108, 108.' For example, the first group of bitline decoder circuits 114 may be arranged at a first side of the array 112 (towards the bottom of FIG. 1), while corresponding ones of the second group of bitline decoder circuits 116 may be arranged at a second side (towards the top of FIG. 1) of the array 112 that is opposite of the first side. The first group of wordline decoder circuits 118 and the corresponding second group of wordline decoder circuits 120 may be arranged on third and fourth opposite sides (towards the left and right, respectively, of FIG. 1) of the array 112. The location of the various bitline and wordline decoder circuits is shown for illustrative purposes only and is a non-limiting factor of the present disclosure.

Each of the first plurality of bitline decoder circuits 110 may be coupled to one end of a respective one of the plurality of bitlines 104, and a corresponding one of each of the second plurality of bitline decoder circuits 110' may be coupled to the other end of a respective one of the plurality of bitlines 104. For example, the bitline decoder circuit 110-2 may be coupled to one end of one of a respective bitline 104-2, and the bitline decoder circuit 110'-2 may be coupled to the other end of the respective bitline 104-2. Further, each of the first plurality of wordline decoder circuits 108 may be coupled to one end of a respective one of the plurality of wordlines 106, and a corresponding one of each of the second plurality of wordline decoder circuits 108' may be coupled to the other end of a respective one of the plurality of wordlines 106. For example, the wordline decoder circuit 108-3 may be coupled to one end of one of a respective wordline 106-3, and the wordline decoder circuit 108'-3 may be coupled to the other end of the respective wordline 106-3.

Each of the bitline decoder circuits 110, 110'', and each of the wordline decoder circuits 108, 108' may be used to select one or more target memory cells 102. Accessing a target memory cell 102 may include providing a voltage and/or current to a target memory cell 102 from at least one of the plurality of bitline decoder circuits 110, 110,' and one of the wordline decoder circuits 108, 108' associated with the bitline 104 and the wordline 106 coupled to the target memory cell 102. For example, a target memory cell 102 may be selected by activating at least one of the bitline decoder circuits 110-2, 110'-2 coupled to the target memory cell 102 via the bitline 104-2, and by activating at least one of the wordline decoder circuits 108-2, 108'-2 coupled to the target memory cell 102 via the wordline 106-2. Accessing, e.g., thresholding, a target memory cell 102 may include providing a voltage and/or a current on both the associated bitline 104 and wordline 106 that may cause a voltage across the target memory cell 102 to increase above a threshold voltage. For example, a ground reference voltage may be provided on a bitline 104 while a positive voltage is provided on a wordline 106 such that a voltage difference between ground and the positive voltage is greater than the threshold voltage. In some embodiments, a positive voltage and a negative voltage may be provided on a bitline 104 and a wordline 106, respectively, to a target memory cell 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse. The electrical pulses may be provided simultaneously to the access lines associated with a target memory cell, or one before the other. For example, the bitline decoder circuit 110 may be activated before the wordline decoder circuit 108 may be activated to provide an electrical pulse on the bitline before providing an electrical pulse on the wordline. When one of the decoder circuits is activated before the other, the target memory cell 102 may be selected upon activation of the other decoder circuit. The pulses may cause the target memory cell 102 to change to a conductive state so that the storage device of the target memory cell 102 may be accessed. Accessing a target memory cell may include reading from the memory cell or writing to the memory cell.

In some embodiments, each group of decoder circuits may be coupled to and enabled by control circuit 122. The control circuit 122 may enable one or more of the bitline decoder circuits 110, 110', and one or more of the wordline decoder circuits 108, 108' to access one or more target memory cells 102. The control circuit 122 may receive control signals, e.g., selection inputs, that may determine which of the respective pairs of bitline decoder circuits 110, 110', and wordline decoder circuits 108, 108' to activate first. The control signals may be based on which of the pairs of bitline decoder circuits 110, 110', and wordline decoder circuits 108, 108' are physically farther and closer to the target memory cell. The relative physical distance from the decoder circuits to the target memory cell may be based on a memory address of the memory cell, and an order in which the decoder circuits are activated may be determined by various other logic (not shown), such a control logic that receives address information, of the apparatus 100.

Once a target memory cell 102 is accessed, the target memory cell may be read or written. Writing a target cell 102 may include changing the data value stored by the target memory cell 102. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell.

In some embodiments, when a target memory cell 102 is to be accessed, a respective bitline decoder circuit 110, 110' and wordline decoder circuit 108, 108' farther from the target memory cell 102 may be activated by the control circuit 122 to select the target memory cell. The bitline and wordline decoder circuits farther from the target memory cell 102 may provide a voltage to a larger associated parasitic load due to the greater physical distance from the target memory cell in comparison to the closer decoder circuit. The larger associated parasitic load may smooth any current spikes generated when the target memory cell thresholds. In some embodiments, when a target memory cell 102 is to be selected, a respective bitline decoder circuit 110, 110' and wordline decoder circuit 108, 108' farther from the target memory cell 102 may be activated before a corresponding bitline decoder circuit 110, 110' and wordline decoder circuit 108, 108' that is closer to the target memory cell 102 may be activated. Stated another way, when selecting a target memory cell 102, the associated pair of bitline decoder circuits 110, 110' may be sequentially activated with the bitline decoder circuit 110, 110' farther from the target memory cell 102 being activated before the closer decoder circuit. The associated pair of wordline decoder circuits 108, 108' may be sequentially activated based on a relative physical distance from the target memory cell 102 similar to how the associated bitline decoder circuits may be activated. By sequentially, e.g., non-simultaneously, activating the bitline decoder circuits 110, 110' and the wordline decoder circuits 108, 108' to select the target memory cell 102 a current spike may be reduced or eliminated. Subsequently activating both decoder circuits of the pair of decoder circuits may further provide sufficient voltage and/or current to ensure the target memory cell is fully selected.

Figure 2A:
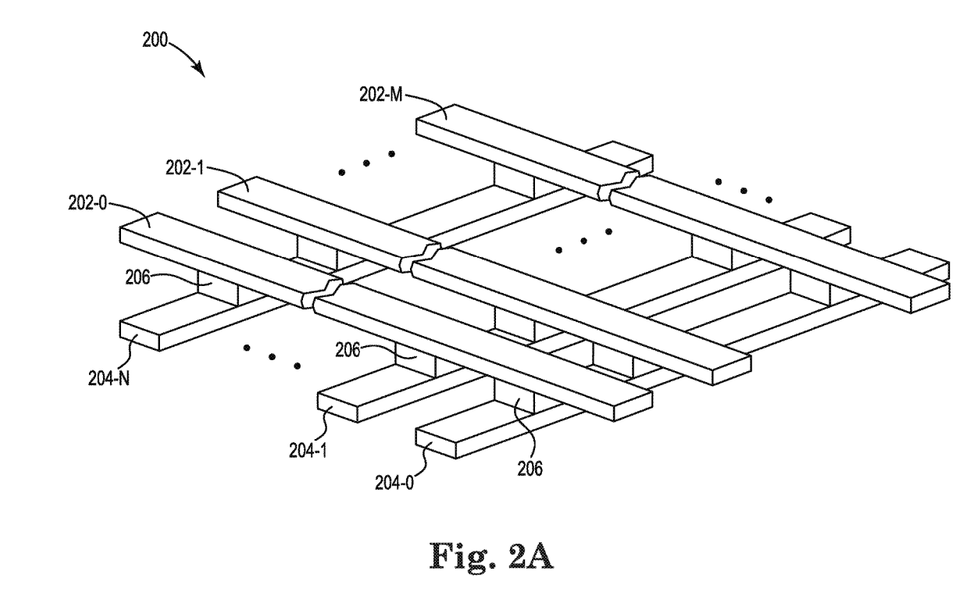
FIG. 2A is a diagram illustrating a portion of a memory array in accordance with an embodiment of the present disclosure.

FIG. 2A is a diagram illustrating a portion of a memory array 200 in accordance with an embodiment of the present disclosure. In the example illustrated in FIG. 2A, the memory array 200 may be a cross-point array including a first plurality of conductive lines 204-0, 204-1, . . . , 204-N, e.g., access lines, which may be referred to herein as wordlines, and a second plurality of conductive lines 202-0, 202-1, . . . , 202-M, e.g., access lines, which may be referred to herein as bitlines. A memory cell 206 may be located at each of the intersections of the wordlines 204-0, 204-1, . . . , 204-N and bitlines 202-0, 202-1, . . . , 202-M and the memory cells 206 may function in a two-terminal architecture, e.g., with a particular word line 204-0, 204-1, . . . 204-N and bitline 202-0, 202-1, . . . , 202-M serving as the electrodes for the memory cells 206.

Each of the memory cells 206 may be resistance variable memory cells, e.g., RRAM cells, CBRAM cells, PCRAM cells, and/or STT-RAM cells, among other types of memory cells. Each of the memory cells 206 may include, for example, a memory element, e.g., memory material, and a selector element, e.g., a selector device, configured as an access device. The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 206 may include a memory portion of the memory cell 206, e.g., the portion programmable to different states. For instance, in resistance variable memory cells, a memory element can include the portion of the memory cell having a resistance that is programmable to particular levels corresponding to particular states responsive to applied programming voltage and/or current pulses, for instance. In some embodiment, the memory cells 206 may be characterized as threshold-type memory cells that are selected, e.g., activated, based on a voltage and/or current crossing a threshold associated with the selector element and/or the memory element. Embodiments are not limited to a particular resistance variable material or materials associated with the memory elements of the memory cells 206. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 206 may be programmed by applying a voltage, e.g., a write voltage, across the memory cells 206 via selected wordlines 204-0, 204-1, . . . , 204-N and bitlines 202-0, 202-1, . . . , 202-M. A sensing, e.g., read, operation may be performed to determine a state of one or more memory cells 206 by sensing current, for example, on one or more bitlines 202-0, 202-1, . . . , 202-M corresponding to the respective memory cells responsive to a particular voltage applied to the selected wordline 204-0, 204-1, . . . , 204-N to which the respective cells may be coupled.

Figure 2B:
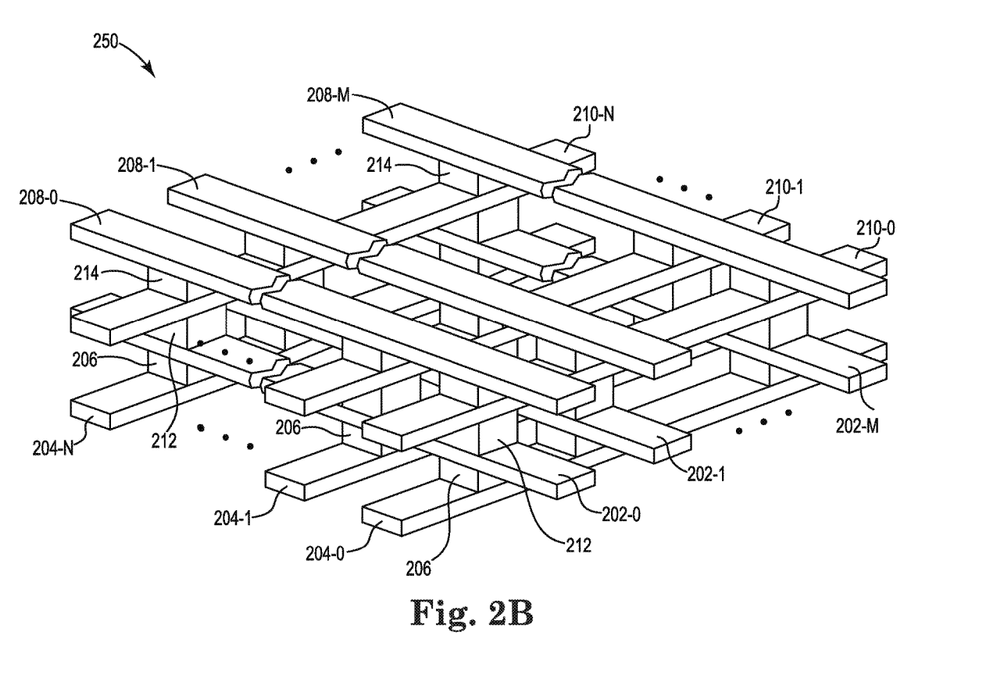
FIG. 2B is a diagram illustrating a portion of a memory array in accordance with an embodiment of the present disclosure.

FIG. 2B is a diagram illustrating a portion of a memory array 250 in accordance with an embodiment of the present disclosure. In the example illustrated in FIG. 2B, the memory array 250 may be configured in a cross-point memory array architecture, e.g., a three-dimensional (3D) cross-point memory array architecture. The multi-deck cross-point memory array 250 comprises a number of successive memory cells, e.g., 214, 212, 206 disposed between alternating, e.g., interleaved, decks of wordlines, e.g., 204-0, 204-1, . . . , 204-N and 210-0, 210-1, . . . , 210-N extending in a first direction and bitlines, e.g., 202-0, 202-1, . . . , 202-M and 208-0, 208-1, . . . , 208-M extending in a second direction. The number of decks may be expanded in number or may be reduced in number, for example. Each of the memory cells 214, 212, 206 may be configured between word lines, e.g., 204-0, 204-1, . . . , 204-N and 210-0, 210-1, . . . , 210-N and bitlines, e.g., 202-0, 202-1, . . . , 202-M and 208-0, 208-1, . . . , 208-M, such that a single memory cell 214, 212, 206 may be directly electrically coupled with and may be electrically coupled in series with its respective bitline and wordline. For example, array 250 may include a three-dimensional matrix of individually-addressable, e.g., randomly accessible, memory cells 206, 212, 214 that may be accessed for data operations, e.g., sense and write, at a granularity as small as a single storage element or multiple storage elements. In a number of embodiments, memory array 250 may include more or less bitlines, wordlines, and/or memory cells than shown in the examples of FIGS. 2A and 2B.

The example memory arrays 200 and 250 may be implemented in the memory 100 of FIG. 1. In one embodiment, the memory array 200 may have bitline decoder circuits coupled to each end of the bitlines, such as the bitline decoder circuits 110, and wordline decoder circuits coupled to each of the wordlines, such as the wordline decoder circuits 108. When accessing a target memory cell, such as a memory cell 206, 212, 214, the bitline decoder circuit and the wordline decoder circuit farthest from the target cell may be activated before the bitline decoder circuit and the wordline decoder circuit closest to the target cell may be activated. By sequentially, e.g., non-simultaneously, activating the respective bitline decoder circuits and the wordlines decoder circuits farthest, an undesirable current spike may be reduced or eliminated.

Figure 3A:
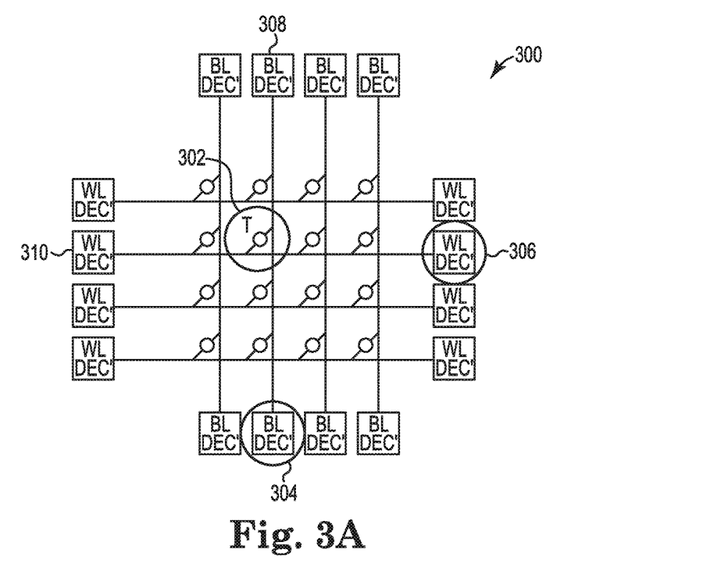
FIG. 3A is a simplified block diagram of a portion of a memory according to an embodiment of the present disclosure.

FIG. 3A is a simplified block diagram of a portion of a memory 300 according to an embodiment of the present disclosure. The memory 300 may include similar elements of the memory 100, which will not be discussed in detail in the interest of brevity. The memory 300 may be used to describe the sequence of activating the decoder circuits when accessing a target memory cell 302. The sequence of activating the bitline decoder circuits and the wordline decoder circuits associated with the target memory cell 302 may reduce or eliminate a current spike that may result in the event the target memory cell 302 thresholds.

The target memory cell may be associated with a pair of bitline decoder circuits 304, 308, and a pair of wordline decoder circuits 306, 310. As shown in FIG. 3A, the target memory cell 302 may be closer to one of the decoder circuits of each associated pair of decoder circuits. For example, the target memory cell 302 may be closer to the bitline decoder circuit 308 than to the bitline decoder circuit 304. With regards to the wordline decoder circuits, the target memory cell 302 may be closer to the wordline decoder circuit 310 than to the wordline decoder circuit 306. This relative physical relation between the target memory cell 302 and the associated bitline and wordline decoder circuits may determine which of the bitline decoder circuit of the pair of bitline decoder circuits and which of the wordline decoder circuit of the pair of wordline decoder circuits are activated first in a sequence of activating the pairs of decoder circuits when selecting the target memory cell 302. In some embodiments, the decoder circuits farther from the target memory cell 302 may be activated before the decoder circuits closer to the target memory cell 302 are activated.

For example, the bitline decoder circuit 304 and the wordline decoder circuit 306 may be activated before the bitline decoder circuit 308 and the wordline decoder circuit 310. Subsequently, the bitline decoder circuit 308 and the wordline decoder circuit 310 may be activated. Accordingly, the decoder circuits of the pairs of decoder circuits associated with the target memory cell 302 may be non-simultaneously activated. While the bitline decoder circuit 304 and the wordline decoder circuit 306 may be activated substantially simultaneously, in some embodiments the bitline decoder circuit 304 and the wordline decoder circuit 306 may be activated one before the other, the order of which may not matter. Stated another way, the pair of bitline decoder circuits 304, 308 associated with the target memory cell 302 may be sequentially activated so that the bitline decoder circuit farther from the target memory cell 302, such as the bitline decoder circuit 304, may be activated before the bitline decoder circuit 308 in the sequence. As for the activation of the wordline decoder circuits, the pair of wordline decoder circuits 306, 310 associated with the target memory cell 302 may be sequentially activated so that the wordline decoder circuit farther from the target memory cell 302, such as the wordline decoder circuit 306, may be activated before the wordline decoder circuit 310 in the sequence. Sequentially activating the respective pairs of decoder circuits may reduce or eliminate any resulting current spike that may occur due to the memory cell transitioning through a negative voltage differential. The current spike may be reduced or eliminated due to the larger parasitic load that may exist between the target memory cell and the decoder circuits farther away.

Figure 3B:
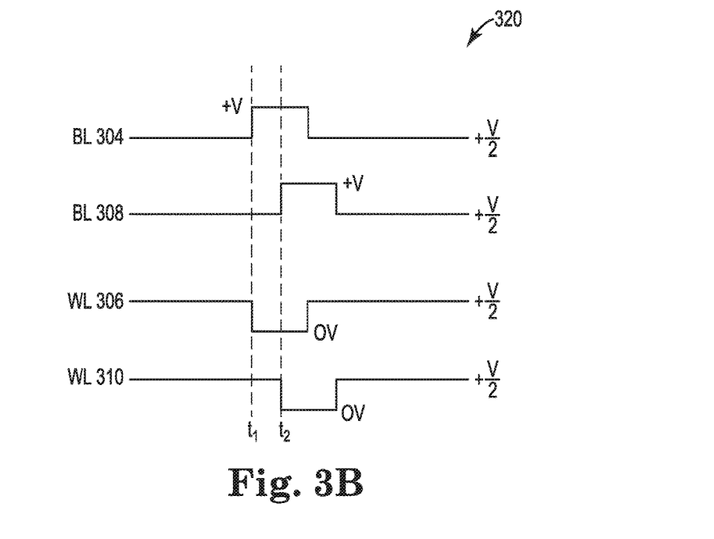
FIG. 3B is a timing diagram of various signals during a memory operation in accordance with an embodiment of the present disclosure.

FIG. 3B is a timing diagram 320 of various signals during a memory operation in accordance with an embodiment of the present disclosure. The timing diagram 320 shows the voltages provided by the pair of bitline decoder circuits 304, 308, and the pair of wordline decoder circuits 306, 310 when selecting the target memory cell 302 of FIG. 3A. The bitline decoder circuit and wordline decoder circuits may by providing a positive pre-charge voltage to the bitlines and wordlines prior to and subsequent to providing a pulse to activate a target memory cell. For example, the pre-charge voltage may be +V/2, which may be present on the bitline and wordlines prior to activation of one more target cells. The pre-charge voltage may be provided by a pre-charge circuit (not shown), in some embodiments. The relative timing of the respective voltages provided to the target memory cell 302 by the pair of bitline decoder circuits 304, 308, and the pair of wordline decoder circuits 306, 310 may reduce or eliminate the occurrence of a current spike at the target memory cell 302.

The timing diagram 320 shows the target memory cell 302 may be selected by the associated pairs of decoder circuits providing electrical pulses. At time t1, the bitline decoder circuit 304, which is farther from the target memory cell 302 than the bitline decoder circuit 308, may provide a positive voltage pulse +V to the target memory cell 302. Also at time t1, the wordline decoder circuit 306 may provide a reference voltage (e.g., ground, 0V) to the target memory cell 302. If the voltage difference between the provided positive voltage and the provided ground voltage is greater than a threshold voltage of the target memory cell 302, the target memory cell 302 may threshold and conduct current. However, in the event the target memory cell 302 thresholds, the severity of any current spike may be mitigated by the parasitic load of the portion of the bitline between the bitline decoder circuit 304 and the target cell. As previously described, this parasitic load may be greater than the parasitic load between the bitline decoder circuit 308 and the target memory cell due to the greater physical distance between the bitline decoder circuit 304 and the target cell in comparison to the physical distance between the bitline decoder circuit 308 and the target memory cell.

At time t2, the bitline decoder circuit 308, which is closer to the target memory cell 302 than the bitline decoder circuit 304, may provide a positive voltage +V. Also at time t2, the wordline decoder circuit 310, which is the closer of the two wordline decoder circuits, may provide the ground reference voltage. By activating the bitline decoder circuit and the wordline decoder circuit that are farther away from the target memory cell 302 before activating the bitline decoder circuit and wordline decoder circuit closer to the target memory cell 302, the occurrence of a current spike may be reduced or eliminated. The bitline and wordline decoder circuits closer to the target memory cell 302 may be subsequently activated to provide additional voltage and/or current to the target memory cell 302.

Figure 4A:
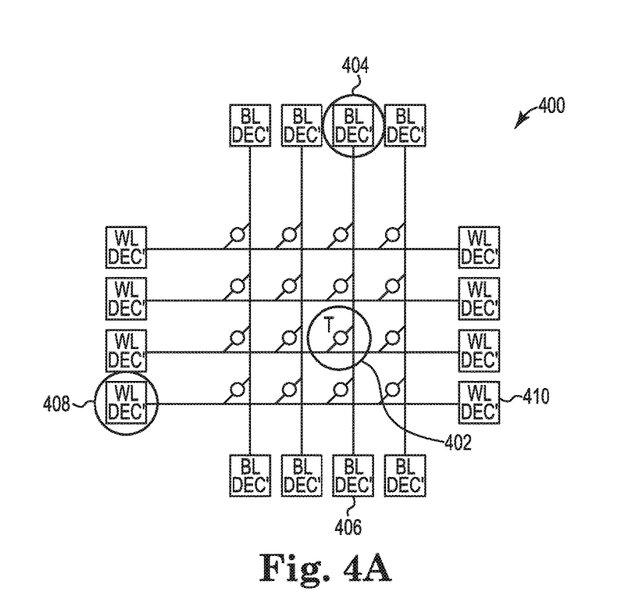
FIG. 4A is a simplified block diagram of a portion of a memory 400 according to an embodiment of the present disclosure.

FIG. 4A is a simplified block diagram of a portion of a memory 400 according to an embodiment of the present disclosure. The memory 400 may include similar elements of the memory 100, which will not be discussed in detail in the interest of brevity. The memory 400 may be used to describe the sequence of activating the decoder circuits when accessing target memory cell 402. The sequence of activating the bitline decoder circuits and the wordline decoder circuits associated with the target memory cell 402 may reduce or eliminate a current spike that may result in the event the target memory cell 402 thresholds.

The target memory cell may be associated with a pair of bitline decoder circuits 404, 406, and a pair of wordline decoder circuits 408, 410. As shown in FIG. 4A, the target memory cell 402 may be closer to one of the decoder circuits of each associated pair of decoder circuits. For example, the target memory cell 402 may be closer to the bitline decoder circuit 406 than to the bitline decoder circuit 404. With regards to the wordline decoder circuits, the target memory cell 302 may be closer to the wordline decoder circuit 410 than to the wordline decoder circuit 408. This relative physical relation between the target memory cell 402 and the associated bitline and wordline decoder circuits may determine which of the bitline decoder circuit of the pair of bitline decoder circuits and which of the wordline decoder circuit of the pair of wordline decoder circuits are activated first in a sequence of activating the pairs of decoder circuits when selecting the target memory cell 402. In some embodiments, the decoder circuits farther from the target memory cell 402 may be activated before the decoder circuits closer to the target memory cell 402 are activated.

For example, the bitline decoder circuit 404 and the wordline decoder circuit 408 may be activated before the bitline decoder circuit 406 and the wordline decoder circuit 410. Subsequently, the bitline decoder circuit 406 and the wordline decoder circuit 410 may be activated. Accordingly, the decoder circuits of the pairs of decoder circuits associated with the target memory cell 402 may be non-simultaneously activated. Stated another way, the pair of bitline decoder circuits 404, 406 associated with the target memory cell 402 may be sequentially activated so that the bitline decoder circuit farther from the target memory cell 402, such as the bitline decoder circuit 404, may be activated before the bitline decoder circuit closer to the target memory cell in the sequence. As for the activation of the wordline decoder circuits, the pair of wordline decoder circuits 408, 410 associated with the target memory cell 402 may be sequentially activated so that the wordline decoder circuit farther from the target memory cell 402, such as the wordline decoder circuit 408, may be activated before the wordline decoder circuit closer to the target memory cell 402 in the sequence. Sequentially activating the respective pairs of decoder circuits may reduce or eliminate any resulting current spike that may occur due to the memory cell transitioning through a negative voltage differential. The current spike may be reduced or eliminated due to the larger parasitic load that may exist between the target memory cell and the decoder circuits farther away.

Figure 4B:
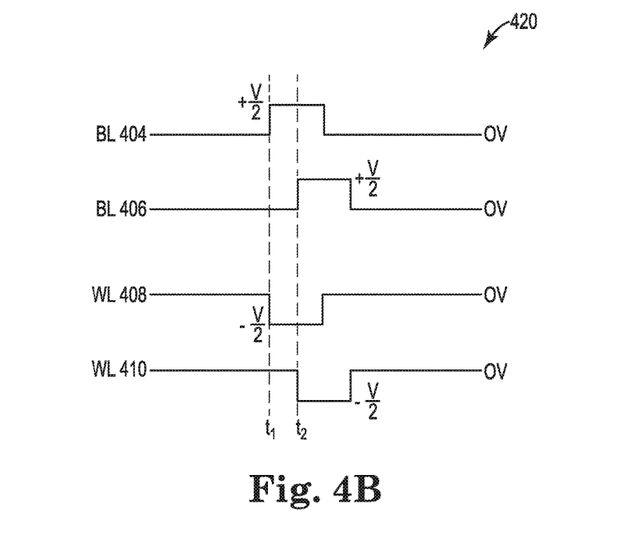
FIG. 4B is a timing diagram of various signals during a memory operation in accordance with an embodiment of the present disclosure.

FIG. 4B is a timing diagram 420 of various signals during a memory operation in accordance with an embodiment of the present disclosure. The timing diagram 420 shows the voltages provided by the pair of bitline decoder circuits 404, 406, and the pair of wordline decoder circuits 408, 410 when selecting the target memory cell 402 of FIG. 4A. In the embodiment of FIG. 4B, the pre-charge voltage present on the wordlines and bitlines may be a reference voltage, ground for example. The relative timing of the respective voltages provided to the target memory cell 402 by the pair of bitline decoder circuits 404, 406, and the pair of wordline decoder circuits 408, 410 may reduce or eliminate the occurrence of a current spike at the target memory cell 402.

The timing diagram 420 shows the target memory cell 402 may be selected by the associated pairs of decoder circuits providing electrical pulses. At time t1, the bitline decoder circuit 404, which is farther from the target memory cell 402 than the bitline decoder circuit 406, may provide a positive voltage pulse +V/2 to the target memory cell 302. Also at time t1, the wordline decoder circuit 408 may provide a negative voltage pulse −V/2 to the target memory cell 402. If the voltage difference between the provided positive voltage and the provided negative voltage, which is across the target memory cell 402, is greater than a threshold voltage of the target memory cell 402, the target memory cell 402 may threshold and conduct current. However, in the event the target memory cell 302 thresholds, the severity of any current spike may be mitigated by the parasitic load of the portion of the bitline between the bitline decoder circuit 304 and the target cell. As previously described, this parasitic load may be greater than the parasitic load between the bitline decoder circuit 308 and the target memory cell due to the greater physical distance between the bitline decoder circuit 304 and the target cell in comparison to the physical distance between the bitline decoder circuit 308 and the target memory cell.

At time t2, the bitline decoder circuit 406, which is closer to the target memory cell 402 than the bitline decoder circuit 404, may provide a positive voltage pulse +V/2. Also at time t2, the wordline decoder circuit 310, which is the closer of the two wordline decoder circuits, may be activated to provide a negative voltage pulse −V/2. By activating the bitline decoder circuit and the wordline decoder circuit that are farther away from the target memory cell 402 before activating the bitline decoder circuit and wordline decoder circuit closer to the target memory cell 402, the occurrence of a current spike may be reduced or eliminated. The bitline and wordline decoder circuits closer to the target memory cell 402 may be subsequently activated to provide additional voltage and/or current to the target memory cell 402.

Figure 5:
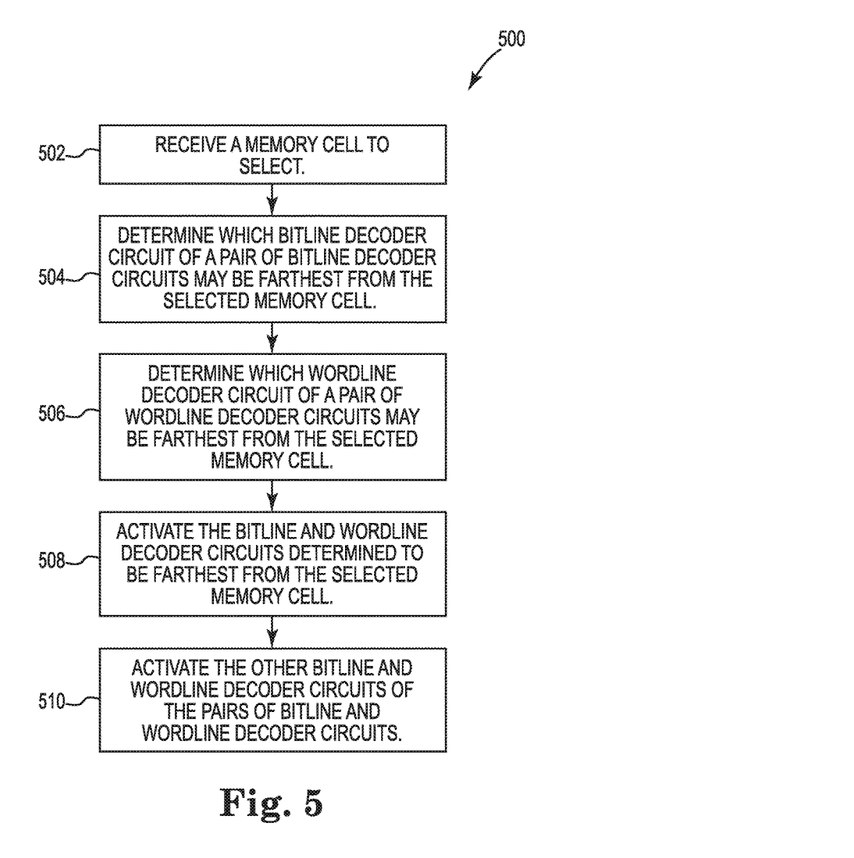
FIG. 5 is an example method flow diagram of a memory operation in accordance with an embodiment of the present disclosure.

FIG. 5 is a flow diagram of a method 500 in accordance with an embodiment of the present disclosure. The method 500 may be an example method for implementing an embodiment of the present disclosure. The method 500 may be implemented on a memory 100 of FIG. 1, for example, and may reduce or eliminate current spikes that may occur when selecting a memory cell. The method 500 may be implemented in other memories having decoder circuits at each end of at least some access lines of a memory array so that a pair of decoder circuits is associated with the access lines. The method 500 may result in selecting a target memory cell by activating a bitline decoder circuit and a wordline decoder circuit farther from the target memory cell before activating a corresponding bitline decoder circuit and wordline decoder circuit, which may be closer to the target memory cell.

The method 500 may begin at step 502, which may include receiving a memory cell to select, which may be part of a memory address provided by a memory controller, for example. The memory address may be received by a control logic or address information receiving circuit of a memory, which may be used to determine the physical location of the memory cell with respect to the memory cell to select. The step 504 may include determining which bitline decoder circuit of a pair of bitline decoder circuits may be farther from the selected memory cell. With regards to FIG. 1, each memory cell 102 may have an associated pair of bitline decoder circuits 110, 110', and the relative location of each memory cell with respect to the pair of bitline decoder circuits 110, 110' may determine which of the pair of bitline decoder circuits may be activated first.

The step 506 may include determining which wordline decoder circuit of a pair of wordline decoder circuits may be farthest from the selected memory cell. With regards to FIG. 1, each memory cell 102 may have an associated pair of wordline decoder circuits 108, 108', and the relative location of each memory cell with respect to the pair of wordline decoder circuits 108, 108' may determine which of the pair of wordline decoder circuits may be activated first. In some embodiments, the steps 504 and 506 may be performed in any order with respect to each other. In some embodiments, the steps 504 and 506 may be performed simultaneously.

The step 508 may include activating the bitline and wordline decoder circuits determined to be farthest from the selected memory cell. Activating the bitline and wordline decoder circuits may include activating them simultaneously, or one before the other. By activating the bitline and wordline decoder circuits, the selected memory cell may receive one or more electrical pulses that may cause a selector of the selected memory cell turn on by causing a voltage across the selector to transition above a threshold voltage. In some embodiments, the step 508 may be performed in conjunction with the steps 504 and 506.

The step 510 may include activating the bitline and wordline decoder circuits closest to the selected memory cell. Activating the bitline and wordline decoder circuits closest to the selected memory cell may cause a larger amount of voltage and/or current to be provided to the selected memory cell so that the memory cell is fully activated. The bitline and wordline decoder circuits closest to the selected memory cell may be activated sequentially, e.g., non-simultaneously, to activating the bitline and wordline decoder circuits farthest the selected memory cell.

Figure 6:
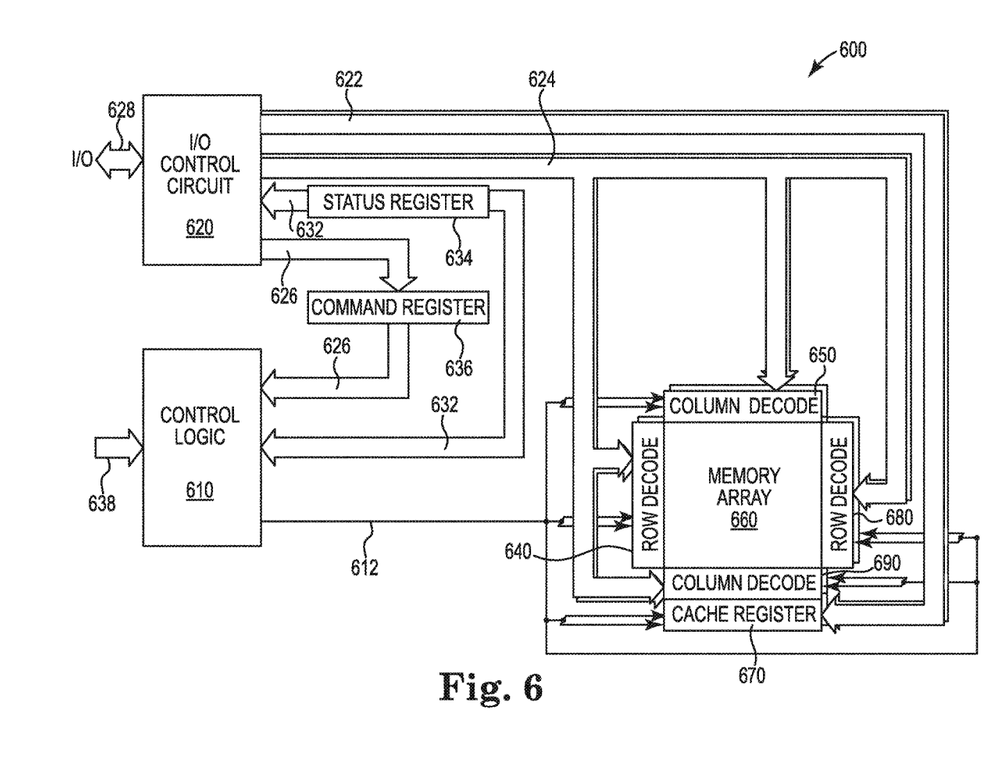
FIG. 6 is a simplified block diagram of a memory according to an embodiment of the present invention

FIG. 6 illustrates a memory 600 according to an embodiment of the present invention. The memory device 600 includes a memory array 660 with a plurality of memory cells that are configured to store data. The memory cells may be accessed in the array through the use of various access lines, such as word lines (WLs) and/or bit lines (BLs). The memory cells may be non-volatile memory cells, such as NAND or NOR flash cells, phase change memory cells, or may generally be any threshold-type memory cells. The memory cells of the memory array 160 may be arranged in a memory array architecture. For example, in one embodiment, the memory cells may be arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

A data strobe signal DQS may be transmitted through a data strobe bus (not shown). The DQS signal may be used to provide timing information for the transfer of data to the memory device 600 or from the memory device 600. The I/O bus 628 may be connected to an I/O control circuit 620 that routes data signals, address information signals, and other signals between the I/O bus 628 and an internal data bus 622, an internal address bus 624, and/or an internal command bus 626. The internal address bus 624 may be provided address information by the I/O control circuit 620. The internal address bus 624 may provide block-row address signals to row decoders 640 and 680, and column address signals to column decoders 650 and 690. The row decoders 640, 680, and column decoders 650, 690 may be used to select blocks of memory cells for memory operations, for example, read and write operations. The row decoders 640, 680, and/or the column decoders 650, 690 may include one or more signal line drivers configured to provide a biasing signal to one or more of the signal lines in the memory array 660. The I/O control circuit 620 may be coupled to a status register 634 through a status register bus 632. Status bits stored by the status register 634 may be provided by the I/O control circuit 620 responsive to a read status command provided to the memory device 604. The status bits may have respective values to indicate a status condition of various aspects of the memory and its operation.

The memory device 600 may also include a control logic 610 that receives a number of control signals 638 either externally or through the command bus 626 to control the operation of the memory device 600. The control signals 638 may be implemented with any appropriate interface protocol. For example, the control signals 638 may be pin based, as is common in dynamic random access memory and flash memory (e.g., NAND flash), or op-code based. Example control signals 638 may include clock signals, read/write signals, clock enable signals, etc. A command register 636 may be coupled to the internal command bus 626 to store information received by the I/O control circuit 620 and provide the information to the control logic 610. The control logic 610 may further access a status register 634 through the status register bus 632, for example, to update the status bits as status conditions change. The control logic 610 may be configured to provide internal control signals to various circuits of the memory device 600. For example, responsive to receiving a memory access command (e.g., read, write), the control logic 610 may provide internal control signals to control various memory access circuits to perform a memory access operation. Specifically, the control logic 610 may be configured to determine a relative location of one or more target memory cells of the memory array 660 to respective decoder circuits included in the row decoders 640, 680, and/or the column decoders 650, 690. The determination of the relative distance between the one or more target memory cells and their respective pairs of decoder circuits may determine a sequence the decoder circuits of the respective pairs of decoder circuits are activated when accessing the one or more target memory cells. Based on the determination, the control logic 610 may provide control signals to the row decoders 640, 680, and/or the column decoders 650, 690 so that the decoder circuits are activated in a desired sequence. Additionally, the control logic 610 may include a control circuit, such as the control circuit 122 of FIG. 1, that may provide the control signals in the desired sequence. The various memory access circuits are used during the memory access operation, and may generally include circuits such as row and column decoders, charge pump circuits, signal line drivers, data and cache registers, I/O circuits, as well as others.

An example sequence for assessing one or more target memory cells of the memory array 660 may follow the example flow diagram of FIG. 5. For example, based on a memory address of a target memory cell, the control logic 610 may determine which of respective pairs of decoder circuits are farther away from and closer to the target memory cell. This information may be provided to the row decoders 640, 680, and/or the column decoders 650, 690 so that the decoder circuits farther away of the respective pairs of decoder circuits are activated before the decoder circuits closer of the respective pairs of the decoder circuits. By sequentially activating the respective pairs of decoder circuits to access the target memory cell, a potential current spike that may result if the target memory cell thresholds may be reduced or eliminated.

A data I/O circuit 670 includes one or more circuits configured to facilitate data transfer between the I/O control circuit 620 and the memory array 660 based on signals received from the control logic 610. In various embodiments, the data I/O circuit 670 may include one or more registers, buffers, and other circuits for managing data transfer between the memory array 660 and the I/O control circuit 620. For example, during a write operation, the I/O control circuit 620 receives the data to be written through the I/O bus 628 and provides the data to the data I/O circuit 670 via the internal data bus 622. The data I/O circuit 670 writes the data to the memory array 660 based on control signals provided by the control logic 610 at a location specified by the row decoders 640, 680 and the column decoders 650, 690. During a read operation, the data I/O circuit reads data from the memory array 660 based on control signals provided by the control logic 610 at an address specified by the row decoders 640, 680 and the column decoders 650, 690. The data I/O circuit provides the read data to the I/O control circuit via the internal data bus 622. The I/O control circuit 620 then provides the read data on the I/O bus 628.

The foregoing disclosure describes examples of current spike limitation in threshold switching memories, for example. The example current spike limitation methods and circuits may include sequentially activating a pair of bitline decoder circuits based on a relative physical distance from a target memory cell, for example. The bitline decoder circuit farthest from the target memory cell may be activated first. A pair of wordline decoder circuits associated with the target memory cell may be similarly activated. As a result of sequentially activating the decoder circuits based on a physical distance from the target memory cell, a current spike generated from the memory switching into an on state may be reduced or eliminated.

What is claimed is:

1. An apparatus, comprising:
    a plurality of decoder circuits including a pair of decoder circuits; and
    a control circuit coupled to the plurality of decoder circuits, the control circuit configured to activate a first one of the pair of decoder circuits based on a first parasitic load before a second one of the pair of decoder circuits based on a second parasitic load.

2. The apparatus of claim 1, wherein the control circuit is configured to activate a target memory cell based on a memory address of the pair of decoder circuits.

3. The apparatus of claim 1, wherein the control circuit is configured to sequentially activate the first one of the pair of decoder circuits before the second one of the pair of first decoder circuits based, at least in part, on the first parasitic load being larger than the second parasitic load.

4. The apparatus of claim 3, wherein the first one of the pair of decoder circuits is farther from the memory cell than the second one of the pair of decoder circuits.

5. The apparatus of claim 3, wherein the first parasitic load provides a larger associated parasitic load than the second parasitic load when the target memory is selected.

6. The apparatus of claim 1, wherein the first one of the pair of decoder circuits is coupled to an end of an access line and the second one of the pair of decoder circuits is coupled to the other end of the access line.

7. The apparatus of claim 1, further comprising:
    an array of memory cells, each memory cell of the array of memory cells coupled to a respective pair of decoder circuits of the plurality of decoder circuits.

8. The apparatus of claim 1, wherein the control circuit is configured to provide control signals that indicate a sequence of activation for a plurality of pairs of decoder circuits of the plurality of decoder circuits, the plurality of pairs of decoder circuits including the pair of decoder circuits.

9. The apparatus of claim 8, wherein each pair of decoder circuits, upon activation, is configured to change a conductive state of a respective target memory cell such that a storage device of the target memory cell may be accessed.

10. The apparatus of claim 8, wherein the control circuit is configured to determine a relative distance of a respective target memory cell for each of the pairs of decoder circuits.

11. The apparatus of claim 8, wherein each of the pairs of decoder circuits comprise row decoders.

12. The apparatus of claim 8, wherein each of the pairs of decoder circuits comprise column decoders.

13. The apparatus of claim 8, wherein each of the pairs of decoder circuits comprise a row decoder and a column decoder coupled to a target memory cell.

14. An apparatus, comprising:
    a pair of decoder circuits; and
    a control circuit coupled to the pair of decoder circuits, wherein a first one of the pair of decoder circuits associated with a first parasitic load is activated before a second one of the pair of decoder circuits associated with a second parasitic load.

15. The apparatus of claim 14, further comprising:
    an additional pair of decoder circuits; and
    a memory cell coupled to the pair of decoder circuits and the additional pair of decoder circuits.

16. The apparatus of claim 15, wherein the control circuit is configured to sequentially activate the pair of decoder circuits before the additional pair of decoder circuits to select the memory cell.

17. The apparatus of claim 15, wherein the control circuit is configured to sequentially activate individual ones of the pair of decoder circuits and the additional pair of decoder circuits to select the memory cell.

18. The apparatus of claim 14, wherein the first parasitic load is based on a first distance to the memory cell that is greater than a second distance to the memory cell associated with the second parasitic load.

19. A method, comprising:
    non-simultaneously activating a first one of a pair of decoder circuits based on a first parasitic load; and
    non-simultaneously activating a second one of the pair of decoder circuits based on a second parasitic load.

20. The method of claim 19, further comprising:
    determining which of the pair of decoder circuits is farther from the memory cell based at least on a respective distance to a memory cell, each respective distance associated with the first parasitic load or the second parasitic load.

* * * * *